United States Patent
Lin et al.

(10) Patent No.: US 10,658,228 B2
(45) Date of Patent: May 19, 2020

(54) SEMICONDUCTOR SUBSTRATE STRUCTURE AND SEMICONDUCTOR DEVICE AND METHODS FOR FORMING THE SAME

(71) Applicant: Vanguard International Semiconductor Corporation, Hsinchu (TW)

(72) Inventors: Chih-Hung Lin, Taichung (TW); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/032,895

(22) Filed: Jul. 11, 2018

(65) Prior Publication Data

US 2020/0020573 A1 Jan. 16, 2020

(51) Int. Cl.
*H01L 21/762* (2006.01)
*H01L 21/02* (2006.01)
*H01L 21/8234* (2006.01)

(52) U.S. Cl.
CPC .. *H01L 21/76278* (2013.01); *H01L 21/02554* (2013.01); *H01L 21/823493* (2013.01)

(58) Field of Classification Search
CPC ......... H01L 21/76278; H01L 21/02554; H01L 21/823493
USPC ........................................................ 257/288
See application file for complete search history.

(56) References Cited

U.S. PATENT DOCUMENTS

| 10,068,965 | B1 * | 9/2018 | Qiao | H01L 29/0886 |
| 2012/0043608 | A1 * | 2/2012 | Yang | H01L 29/0653 257/336 |
| 2017/0025532 | A1 | 1/2017 | Mori et al. | |
| 2018/0130907 | A1 * | 5/2018 | Hung | H01L 29/7835 |

FOREIGN PATENT DOCUMENTS

TW          I257697 B        7/2006

OTHER PUBLICATIONS

Taiwanese Office Action and Search Report for Taiwanese Application No. 107112557, dated Jul. 23, 2018.

* cited by examiner

*Primary Examiner* — Tong-Ho Kim
(74) *Attorney, Agent, or Firm* — Birch, Stewart, Kolasch & Birch, LLP

(57) ABSTRACT

A semiconductor device is provided. The semiconductor device includes a substrate, an oxide layer disposed over the substrate, and a first epitaxial layer disposed over the oxide layer. The first epitaxial layer has the first conductivity type. The semiconductor device also includes a second epitaxial layer disposed over the first epitaxial layer and a third epitaxial layer disposed over the second epitaxial layer. The second epitaxial layer has a second conductivity type that is opposite to the first conductivity type. The third epitaxial layer has the first conductivity type.

18 Claims, 12 Drawing Sheets

SEMICONDUCTOR SUBSTRATE STRUCTURE AND SEMICONDUCTOR DEVICE AND METHODS FOR FORMING THE SAME

BACKGROUND

Technical Field

The present disclosure relates to a semiconductor device and a method for forming the semiconductor device. The disclosure in particular relates to a semiconductor substrate and a method for forming the semiconductor substrate.

Description of the Related Art

Semiconductor devices are used in a variety of electronic applications, such as personal computers, cell phones, and digital cameras. Semiconductor devices are typically fabricated by sequentially depositing insulating layers or dielectric layers, conductive layers, and semiconductor layers over a semiconductor substrate, and patterning the various material layers using lithography to form circuit components and electronic elements.

In the semiconductor industry, silicon-on-insulator (SOI) is a term that refers to a silicon-insulator-silicon substrate which can replace conventional silicon substrates. The silicon-on-insulator includes a buried oxide layer sandwiched between the base silicon layer and the top silicon layer. Compared to conventional bulk silicon substrates, silicon-on-insulator substrates may have lower leakage current, higher power efficiency, and lower parasitic capacitance.

However, in general, silicon-on-insulator devices may suffer from the backside bias effect, which is also called the substrate bias effect. The backside bias effect occurs when the breakdown voltage of a metal-oxide-semiconductor field-effect transistor (MOSFET) is affected by the voltage that is applied to the handling wafer. The backside bias effect may alter the breakdown voltage of a metal-oxide-semiconductor field-effect transistor. Generally, additional circuits will be disposed to minimize the impact of the backside bias effect.

Although existing silicon-on-insulator (SOI) substrates of semiconductor devices and methods for forming the same have been adequate for their intended purposes, they have not been entirely satisfactory in all respects. Therefore, up to the present, there are still some problems that can be improved in the technology of SOI substrates of semiconductor devices.

SUMMARY

In accordance with some embodiments of the present disclosure, a semiconductor device is provided. The semiconductor device includes a substrate, an oxide layer disposed over the substrate, and a first epitaxial layer disposed over the oxide layer. The first epitaxial layer has the first conductivity type. The semiconductor device also includes a second epitaxial layer disposed over the first epitaxial layer and a third epitaxial layer disposed over the second epitaxial layer. The second epitaxial layer has a second conductivity type that is opposite to the first conductivity type. The third epitaxial layer has the first conductivity type.

In accordance with some embodiments of the present disclosure, a semiconductor substrate structure is provided. The semiconductor substrate structure includes a substrate, an oxide layer disposed over the substrate and a first epitaxial layer disposed over the oxide layer. The first epitaxial layer has the first conductivity type. The semiconductor device also includes a second epitaxial layer disposed over the first epitaxial layer and a third epitaxial layer disposed over the second epitaxial layer. The second epitaxial layer has a second conductivity type that is opposite to the first conductivity type. The third epitaxial layer has the first conductivity type.

In accordance with some embodiments of the present disclosure, a method for forming a semiconductor device is provided. The method includes: providing a substrate; forming an oxide layer over the substrate; forming a first epitaxial layer over the oxide layer; forming a second epitaxial layer over the first epitaxial layer; and forming a third epitaxial layer over the second epitaxial layer. The first epitaxial layer includes dopants of the first conductivity type. The second epitaxial layer includes dopants of a second conductivity type that is opposite to the first conductivity type. The third epitaxial layer includes dopants of the first conductivity type.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
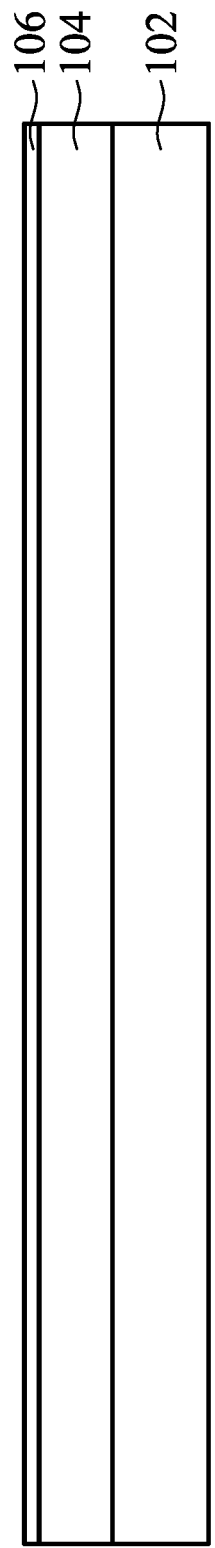
FIGS. 1A-1H illustrate the cross-sectional views of the semiconductor device during the manufacturing process in accordance with some embodiments of the present disclosure.

The semiconductor device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The semiconductor device provided in the present disclosure includes a stacked structure of the epitaxial layers having a specific combination of conductivity types (for example, the structure including an epitaxial layer having p-type conductivity—an epitaxial layer having n-type conductivity—an epitaxial layer having p-type conductivity) so that the influence of the backside bias effect on the semiconductor device can be reduced, and the performance of the semiconductor device can be improved. In addition, compared with the n-type or p-type semiconductor layers generally formed by the ion implantation process, the n-type or p-type epitaxial layer formed by the epitaxial growth process can have fewer defects and damages, and can further reduce the occurrence of current leakage.

FIGS. 1A-1H illustrate the cross-sectional view of the semiconductor device 10 during the manufacturing process in accordance with some embodiments of the present disclosure. It should be understood that additional operations can be provided before, during, and after the manufacturing process of the semiconductor device, and some of the operations described can be replaced or eliminated in some other embodiments. In addition, additional features may be added to the semiconductor device in accordance with some embodiments of the present disclosure. In some other embodiments, some of the features described below may be replaced or eliminated.

First, referring to FIG. 1A, a substrate 102 is provided, and an oxide layer 104 is formed over the substrate 102. In addition, a semiconductor layer 106 is formed over the oxide layer 104. The substrate 102 may be formed of silicon or other semiconductor materials. In some embodiments, the substrate 102 may include other elementary semiconductor materials such as germanium (Ge). In some embodiments, the substrate may be formed of compound semiconductor materials such as silicon carbide (SiC), gallium nitride (GaN), gallium arsenide (GaAs), indium arsenide (InAs), indium phosphide (InP), or a combination thereof. In some other embodiments, the substrate 102 may be formed of alloy semiconductor materials such as silicon germanium (SiGe), silicon germanium carbide (SiGeC), arsenide gallium phosphide (AsGaP), indium gallium phosphide (InGaP), other suitable materials or a combination thereof. In addition, the substrate 102 is the substrate having n-type conductivity in accordance with some embodiments. In some other embodiments, the substrate 102 is the substrate having p-type conductivity.

The oxide layer 104 may serve as a buried oxide (BOX) layer. The oxide layer 104 may be formed of oxide materials. In some embodiments, the oxide layer 104 includes silicon oxide. In some embodiments, the thickness of the oxide layer 104 is in a range from about 0.3 μm to about 2 μm.

Moreover, the semiconductor layer 106 may be formed of semiconductor materials. In some embodiments, the semiconductor layer 106 includes silicon (Si) such as crystalline silicon (c-Si). The semiconductor layer 106 may include n-type dopants or p-type dopants in accordance with some embodiments. In other words, the semiconductor layer 106 may have n-type conductivity or p-type conductivity. In some embodiments, the conductivity type of the semiconductor layer 106 is p-type. In some embodiments, the thickness of the semiconductor layer 106 is in a range from about 0.5 μm to about 1.5 μm.

In some embodiments, the substrate 102, the oxide layer 104 and the semiconductor layer 106 may be formed by a separation by implantation of oxygen (SIMOX) process. In the separation by implantation of oxygen process, an oxygen ion beam is implanted into the silicon wafer with high energy. Then, the implanted oxygen ion will react with the silicon, and the oxide layer 104 may be formed below the surface of the silicon wafer by using a high-temperature annealing process. In this process, the portion of the silicon wafer below the oxide layer 104 is the substrate 102, and the portion of the silicon wafer above the oxide layer 104 is the semiconductor layer 106.

In some other embodiments, the substrate 102, the oxide layer 104 and the semiconductor layer 106 may be formed by a wafer bonding process, a seed growth process, other applicable processes, or a combination thereof. In the wafer bonding process, the oxide layer 104 is formed below the semiconductor layer 106 by directly bonding the oxidized silicon with the semiconductor layer 106. Then, the semiconductor layer 106 is thinned before the oxide layer 104 and the semiconductor layer 106 are bonded to the substrate 102. On the other hand, in the seed growth process, the semiconductor layer 106 is epitaxially grown on the oxide layer 104, which has already formed on the substrate 102.

Figure 1B:
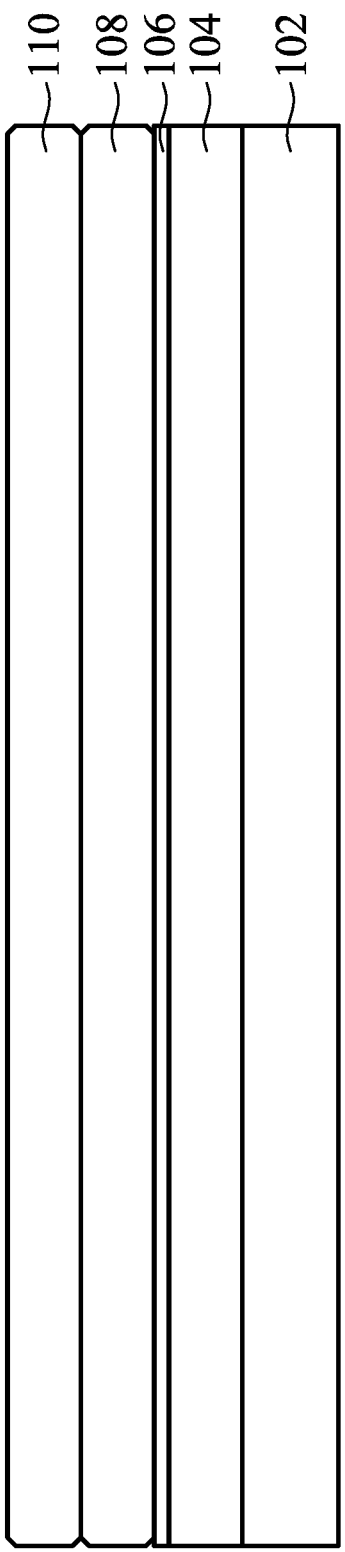

Next, referring to FIG. 1B, a first epitaxial layer 108 is formed over the semiconductor layer 106, and a second epitaxial layer 110 is formed over the first epitaxial layer 108. In some embodiments, the first epitaxial layer 108 is adjacent to the second epitaxial layer 110. In some embodiments, the first epitaxial layer 108 is in direct contact with the second epitaxial layer 110. In addition, in some embodiments, the first epitaxial layer 108 has the first conductivity type and the second epitaxial layer 110 has a second conductivity type that is opposite to the first conductivity type. Specifically, the first epitaxial layer 108 has p-type conductivity, and the second epitaxial layer 110 has n-type conductivity in accordance with some embodiments.

The first epitaxial layer 108 and the second epitaxial layer 110 may be formed of semiconductor materials. In some embodiments, the first epitaxial layer 108 and the second epitaxial layer 110 are formed of silicon. In some embodiments, the first epitaxial layer 108 and the second epitaxial layer 110 may include other elementary semiconductor materials. In addition, in some embodiments, the first epitaxial layer 108 includes the dopants of p-type conductivity, and the second epitaxial layer 110 includes the dopants of n-type conductivity. In some embodiments, the dopant of p-type conductivity may include elements of group III, and the dopant of n-type conductivity may include elements of group V, but are not limited thereto. In some embodiments, the dopant concentration of the first epitaxial layer 108 and the second epitaxial layer 110 each is in a range from about $1 \times 10^{-15}$ cm$^3$ to about $1 \times 10^{-17}$ cm$^{-3}$.

In some embodiments, the first epitaxial layer 108 has a thickness in a range from about 0.5 μm to about 1.5 μm. In some embodiments, the second epitaxial layer 110 has a thickness in a range from about 0.5 μm to about 8 μm. In addition, in some embodiments, the total thickness of the first epitaxial layer 108 and the second epitaxial layer 110 is in a range from about 3 μm to about 11 μm.

In particular, the first epitaxial layer 108 and the second epitaxial layer 110 may be formed by an epitaxial growth process. In some embodiments, the epitaxial growth process may include a molecular beam epitaxy (MBE) process, a liquid phase epitaxy (LPE) process, a solid phase epitaxy (SPE) process, a vapor phase epitaxy (VPE) process, a selective epitaxial growth (SEG) process, a metal organic chemical vapor deposition (MOCVD) process, an atomic layer deposition (ALD) process, or a combination thereof. Compared with the semiconductor layer formed by the ion implantation process, the first epitaxial layer 108 and the second epitaxial layer 110 that are formed by the epitaxial growth process can have fewer defects and damages. The occurrence current leakage can be further reduced.

Figure 1C:
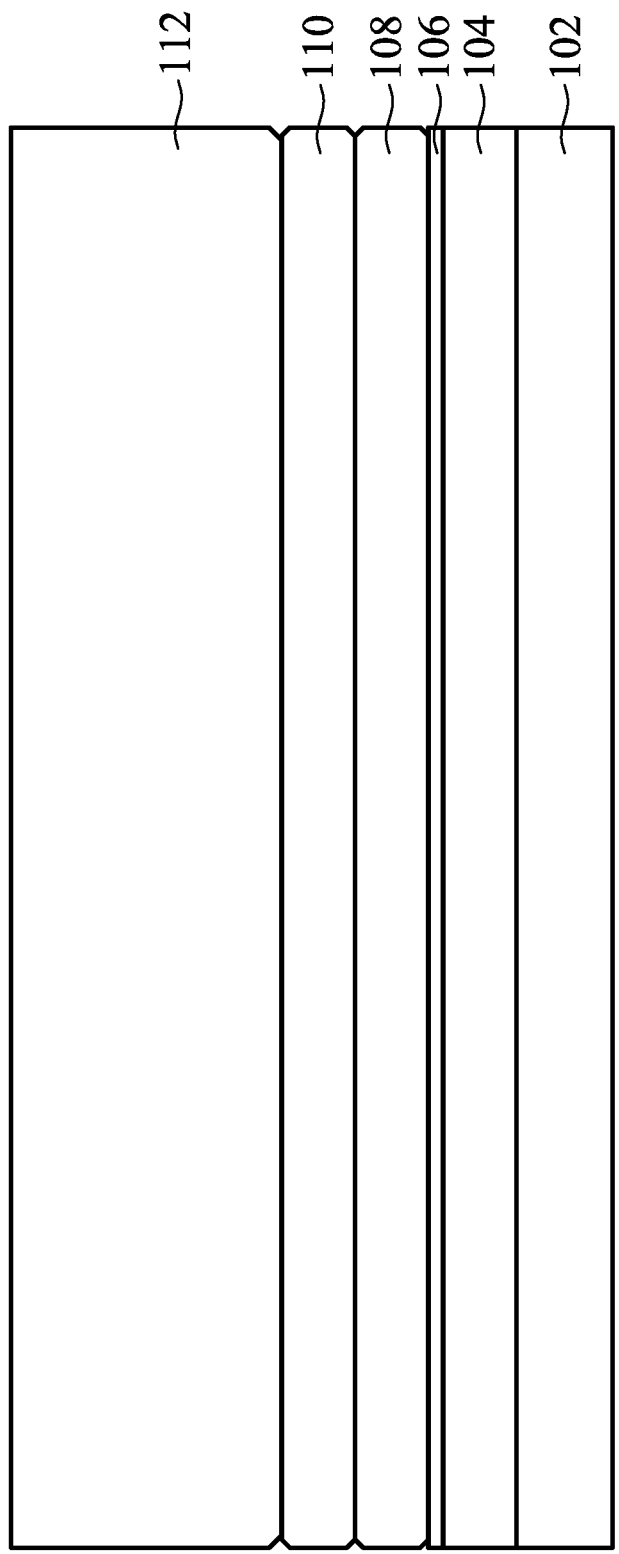

Next, referring to FIG. 1C, a third epitaxial layer 112 is formed over the second epitaxial layer 110. In some embodiments, the second epitaxial layer 110 is in direct contact with the third epitaxial layer 112. In some embodiments, the second epitaxial layer 110 is disposed between the first epitaxial layer 108 and the third epitaxial layer 112, and is in direct contact with the first epitaxial layer 108 and the third epitaxial layer 112. In some embodiments, the third epitaxial layer 112 has the first conductivity type. In other words, the third epitaxial layer 112 and the first epitaxial layer 108 have the same conductivity type while the third epitaxial layer 112 and the second conductivity layer 110 have different conductivity types. Specifically, the third epitaxial layer 112 has p-type conductivity in accordance with some embodiments.

The third epitaxial layer 112 may be formed of semiconductor materials. In some embodiments, the third epitaxial layer 112 may be formed of silicon. In some embodiments, the third epitaxial layer 112 may include other elementary semiconductor materials. In addition, the third epitaxial layer 112 includes the dopants of p-type conductivity in accordance with some embodiments. In some embodiments, the dopant concentration of the third epitaxial layer 112 is in a range from about $1 \times 10^{-15}$ cm$^3$ to about $1 \times 10^{-17}$ cm$^{-3}$. In some embodiments, the third epitaxial layer 112 has a thickness in a range from about 0.5 μm to about 8 μm.

Similarly, the third epitaxial layer 112 may be formed by an epitaxial growth process. In some embodiments, the epitaxial growth process may include a molecular beam epitaxy (MBE) process, a liquid phase epitaxy (LPE) process, a solid phase epitaxy (SPE) process, a vapor phase epitaxy (VPE) process, a selective epitaxial growth (SEG) process, a metal organic chemical vapor deposition (MOCVD) process, an atomic layer deposition (ALD) process, or a combination thereof.

It should be noted that in some embodiments, the stacked structure of the first epitaxial layer 108, the second epitaxial layer 110 and the third epitaxial layer 112 which have a particular combination of conductivity types (i.e. the stacked structure of the p-type first epitaxial layer 108, the n-type second epitaxial layer 110, and the p-type third epitaxial layer 112) can effectively shield signal interference from the backside of the substrate 102. With such a configuration, the influence of the backside bias effect on the semiconductor device can be decreased and the performance of the semiconductor device can be improved accordingly.

Figure 1D:
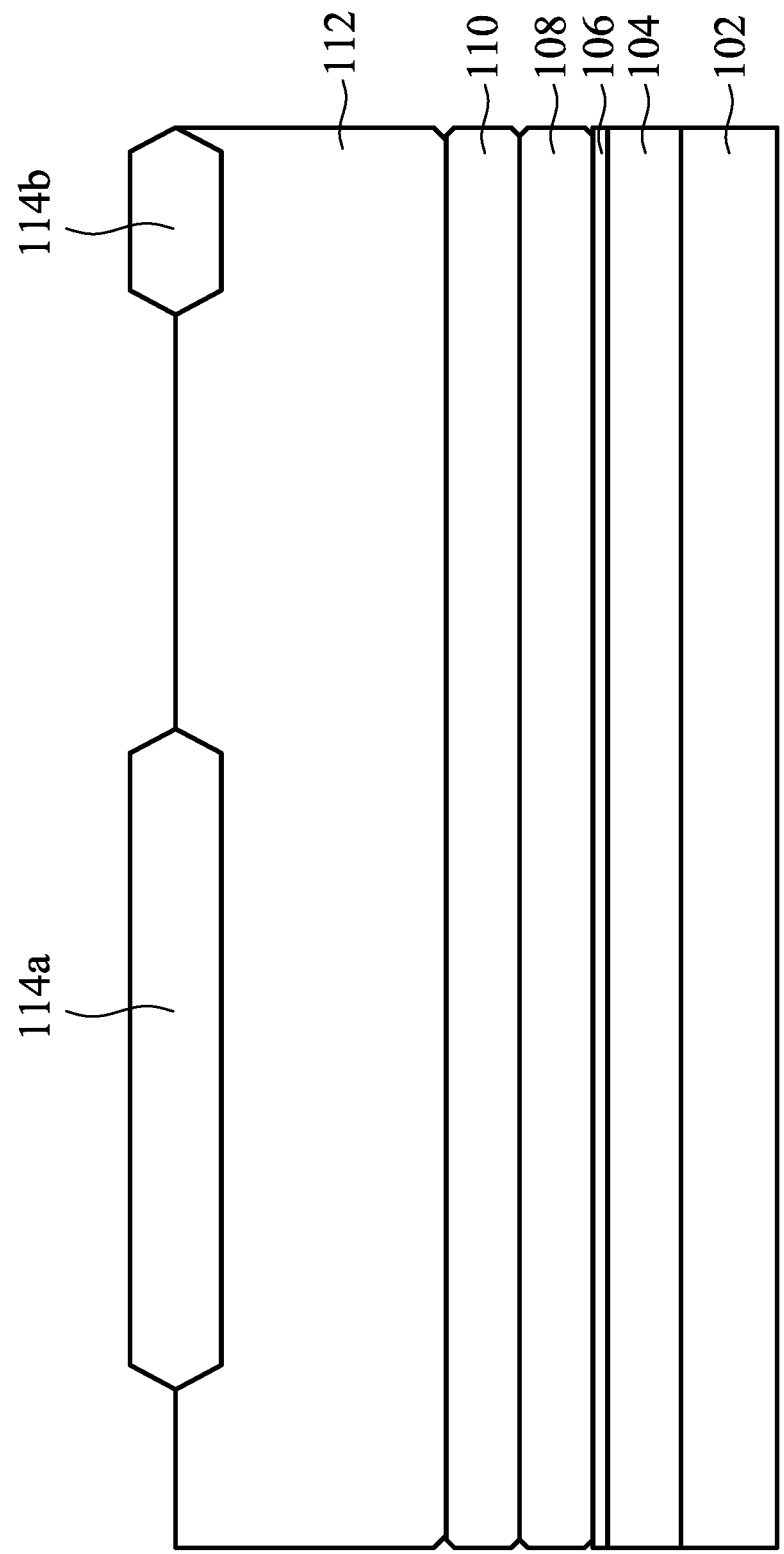

Next, referring to FIG. 1D, an isolation structure 114a and an isolation structure 114b are formed over the third epitaxial layer 112. Specifically, portions of the isolation structures 114a and 114b are embedded in the third epitaxial layer 112, while portions of the isolation structures 114a and 114b are formed over the third epitaxial layer 112. In some embodiments, the isolation structures 114a and 114b may be formed by a local oxidation of silicon (LOCOS) process, a shallow trench isolation (STI) process, or a combination thereof. In some embodiments, isolation structures 114a and 114b are formed of dielectric materials. In some embodiments, the materials of the isolation structures 114a and 114b may include silicon oxide, silicon nitride, silicon oxynitride, any other suitable dielectric material, or a combination thereof.

Figure 1E:
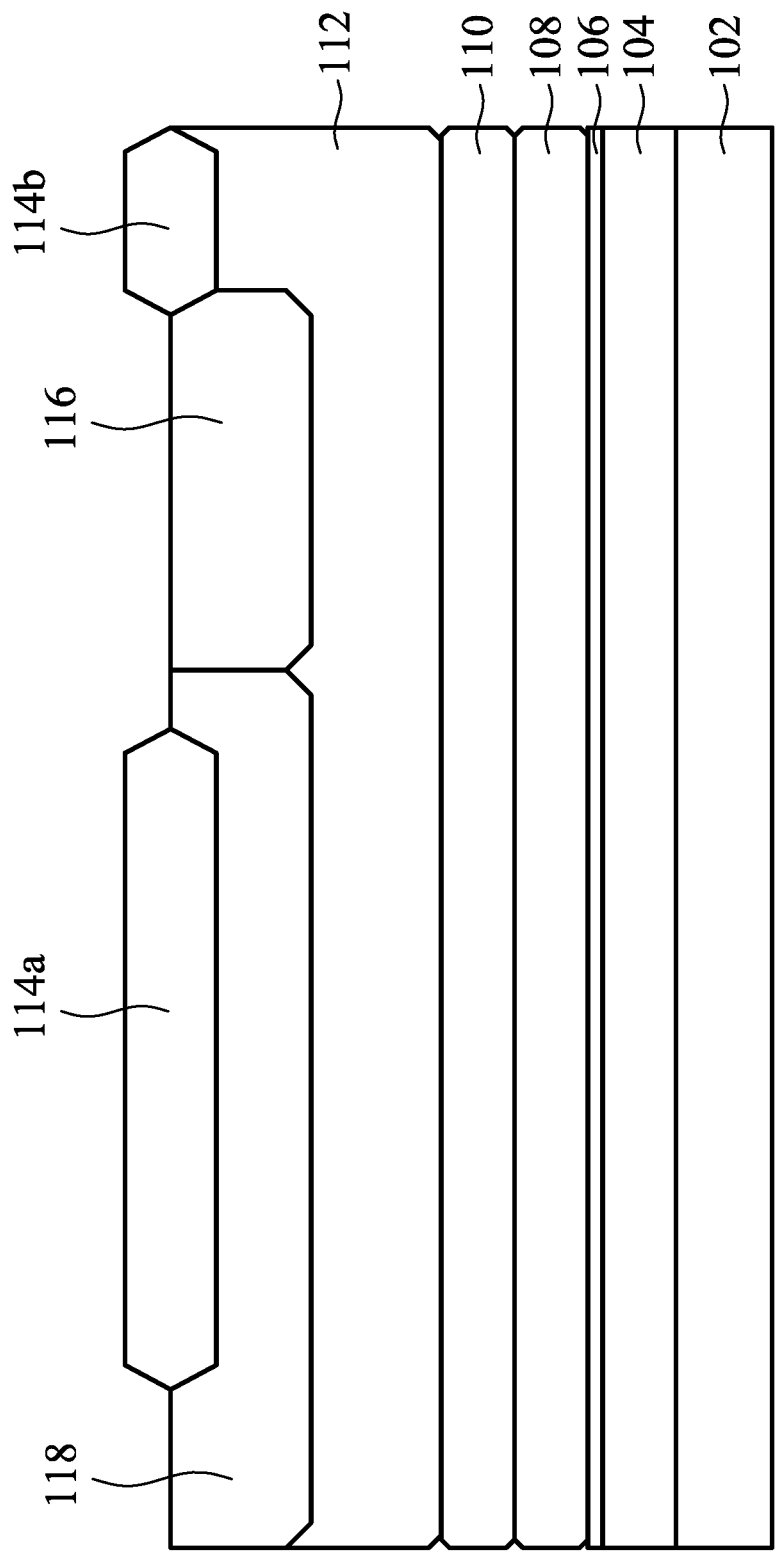

Next, referring to FIG. 1E, a first well region 116 and a second well region 118 that is adjacent to the first well region 116 are formed in the third epitaxial layer 112. As shown in FIG. 1E, a portion of the second well region 118 is formed below the isolation structure 114a, and the first well region 116 is disposed between the isolation structure 114 and the isolation structure 114b.

In some embodiments, the first well region 116 and the second well region 118 may be formed by an ion implantation process. In some embodiments, the first well region 116 and the second well region 118 may be formed by two separate ion implantation processes. The first well region 116 and the second well region 118 may have different conductivity types. In some embodiments, the first well region 116 has the first conductivity type and the second well region 118 has the second conductivity type. Alternatively, in some embodiments, the first well region 116 has the second conductivity type and the second well region 118 has the first conductivity type. Specifically, in some embodiments, the first well region 116 may be a p-type well and the second well region 118 may be an n-type well to serve as an n-type metal-oxide-semiconductor field-effect transistor (NMOS). In some embodiments, the first well region 116 may be an n-type well and the second well region 118 may be a p-type well to serve as a p-type metal-oxide-semiconductor field-effect transistor (PMOS).

Figure 1F:
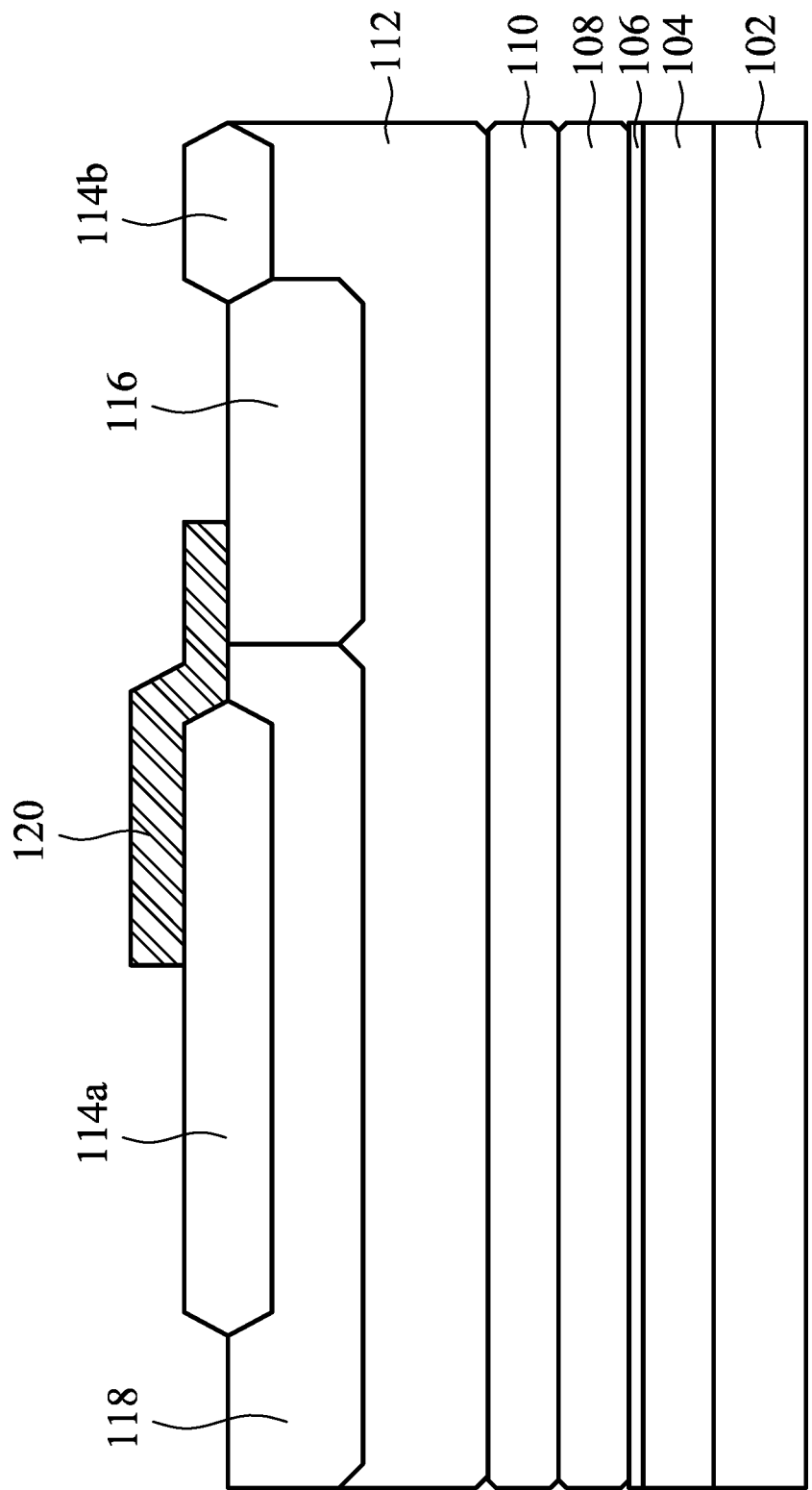

Next, referring to FIG. 1F, a gate structure 120 is formed over the first well region 116 and the second well region 118. The gate structure 120 partially overlaps the first well region 116 and the second well region 118. In addition, the gate structure 120 also covers a portion of the isolation structure 114a. In some embodiments, the gate structure 120 may include single or multiple layers of gate dielectric layers, and single or multiple layers of gate electrode layers.

In some embodiments, the gate dielectric layer may include silicon oxide, silicon nitride, silicon oxynitride, high-k dielectric material, any other suitable dielectric material, or a combination thereof. The high-k dielectric material may include, but is not limited to, metal oxide, metal nitride, metal silicide, transition metal oxide, transition metal nitride, transition metal silicide, metal oxynitride, metal aluminate, zirconium silicate, zirconium aluminate, or a combination thereof. In some embodiments, the gate dielectric layer may be formed by a plasma enhanced chemical vapor deposition (PECVD) process, a spin coating process, any other applicable process, or a combination thereof.

In some embodiments, the gate electrode layer may include amorphous silicon, polycrystalline silicon, metal nitride, conductive metal oxide, metal, any other suitable material, or a combination thereof. The above metal may include, but is not limited to, aluminum (Al), molybdenum (Mo), tungsten (W), titanium (Ti), tantalum (Ta), platinum (Pt), hafnium (Hf), or a combination thereof. The above conductive metal oxide may include, but is not limited to, barium metal oxide or indium tin metal oxide. In some embodiments, the gate electrode layer may be formed by a chemical vapor deposition (CVD) process, a sputtering process, a resistance heating evaporation process, an electron beam evaporation process, a pulsed laser deposition process, or any other applicable process. The chemical vapor deposition process may include low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other applicable process.

In addition, a patterning process may be performed on the gate dielectric layer and the gate electrode layer to form the gate structure 120 in accordance with some embodiments. The patterning process may include a photolithography process and an etching process such as a selective etching process. The photolithography process may include, but is not limited to, photoresist coating (e.g., spin coating), soft baking, hard baking, mask aligning, exposure, post-exposure baking, developing the photoresist, rinsing, drying, or other suitable processes. The etching process may include dry etching process or wet etching process.

Figure 1G:
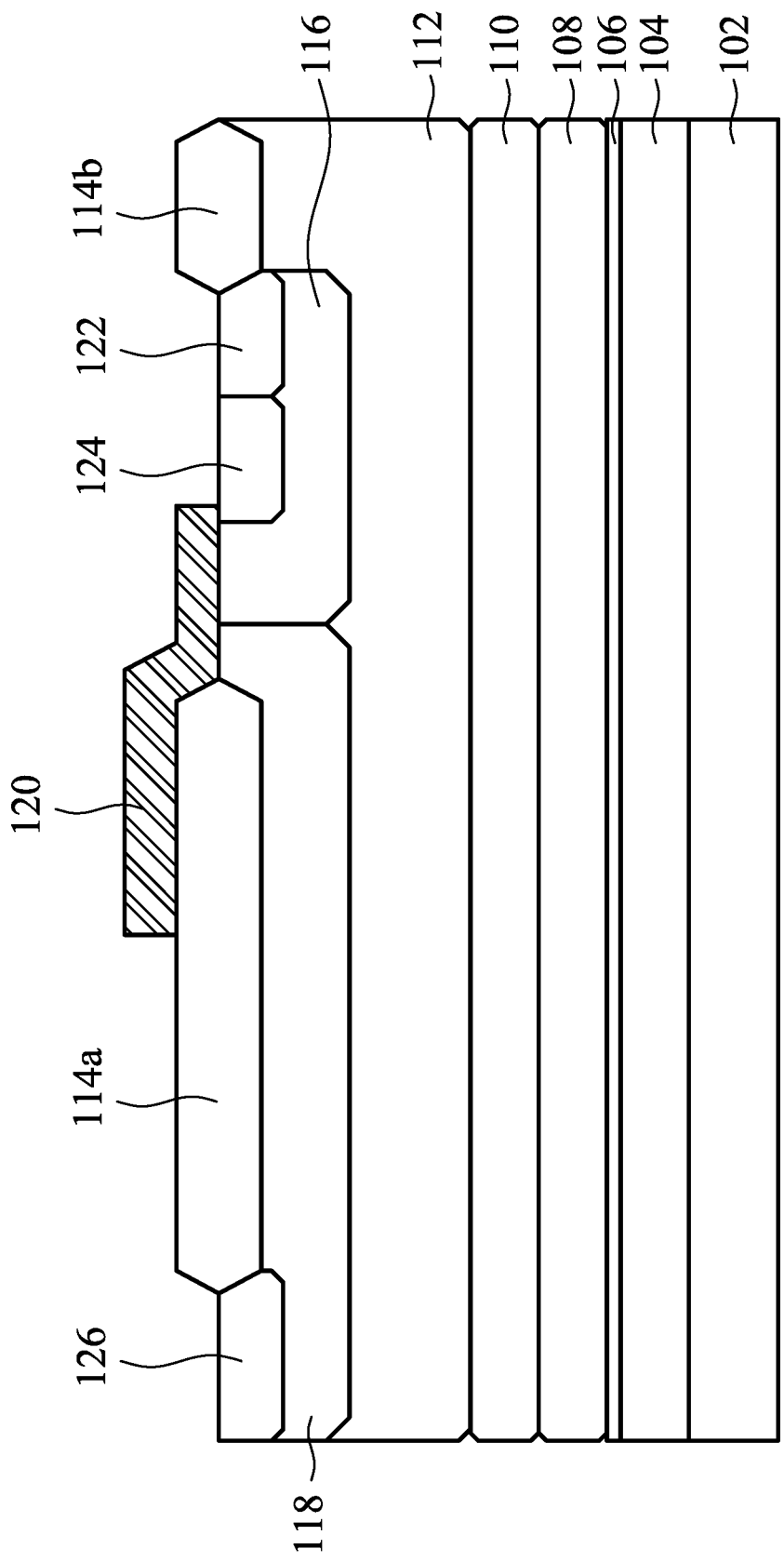

Next, referring to FIG. 1G, a first doped region 122 and a second doped region 124 are formed in the first well region 116, and a third doped region 126 is formed in the second well region 118. The first doped region 122 adjoins the second doped region 124. In some embodiments, the first doped region 122 and the first well region 116 have the same conductivity type, the second doped region 124 and the first well region 116 have different conductivity types, and the third doped region 126 and the second well region 118 have the same conductivity type. In some embodiments, the first doped region 122, the second doped region 124, and the third doped region 126 may be formed by implanting dopants with suitable conductivity types by ion implantation process.

Figure 1H:
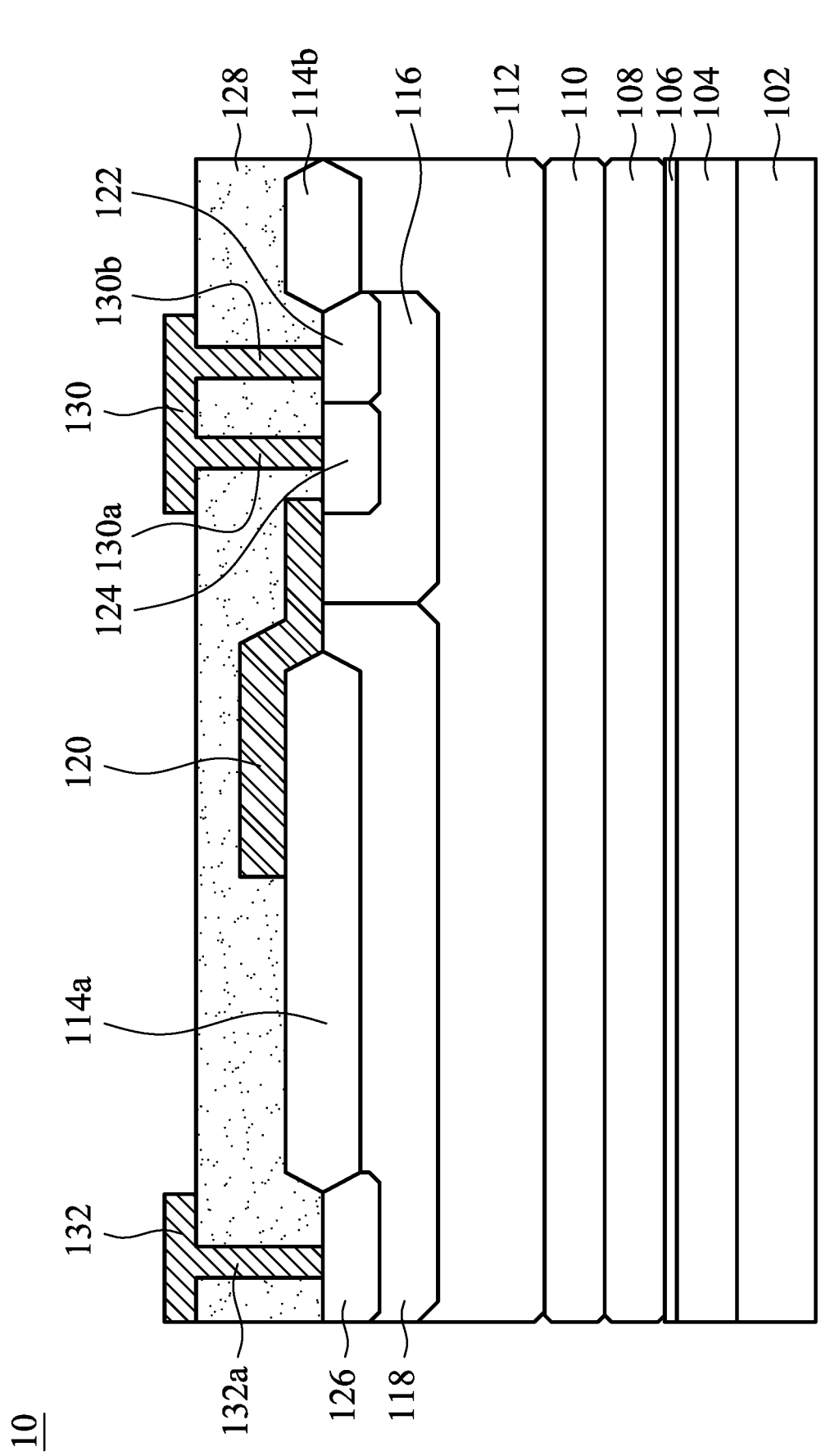

Next, referring to FIG. 1H, an inter-layer dielectric (ILD) layer 128 is formed over the isolation structures 114a and 114b and the gate structure 120. The interlayer dielectric layer 128 also covers the first doped region 122, the second doped region 124, and the third doped region 126. The interlayer dielectric layer 128 may be formed of dielectric materials. In some embodiments, the material of the interlayer dielectric layer 128 may include silicon oxide, silicon nitride, phosphosilicate glass (PSG), borophosphosilicate glass (BPSG), any other suitable dielectric material or a combination thereof In addition, the interlayer dielectric layer 128 may be formed by a chemical vapor deposition (CVD) process, a physical vapor deposition (PVD) process, an atomic layer deposition (ALD) process, a spin coating process, any other applicable process, or a combination thereof.

Furthermore, as shown in FIG. 1H, after the interlayer dielectric layer 128 is formed, a source electrode 130 and a drain electrode 132 are formed over the interlayer dielectric layer 128 in accordance with some embodiments. The source electrode 130 and the drain electrode 132 are correspondingly disposed over the first well region 116 and the second well region 118. In some embodiments, the gate structure 120 is disposed between the source electrode 130 and the drain electrode 132. In addition, via 130a, via 130b and via 132a are formed in the interlayer dielectric layer 128 in accordance with some embodiments. The formation of the semiconductor device 10 is substantially completed here. In some embodiments, the via 130a penetrates the interlayer dielectric layer 128 and contacts the source electrode 130 and the second doped region 124. In some embodiments, the via 132a penetrates the interlayer dielectric layer 128 and contacts the drain electrode 132 and the third doped region 126. As described above, the source electrode 130 may be electrically connected to the second doped region 124 and the first doped region 122 through the vias 130a and 130b respectively, and the drain electrode 132 may be electrically connected to the third doped region 126 through the via 132a.

The source electrode 130, the drain electrode 132, and the vias 130a, 130b and 132a may be formed of polysilicon, metal, or any other suitable conductive material. In some embodiments, the source electrode 130, the drain electrode 132, and the vias 130a, 130b and 132a each may include copper (Cu), aluminum (Al), molybdenum (Mo), tungsten (W), gold (Au), chromium (Cr), nickel (Ni), platinum (Pt), titanium (Ti), iridium (Ir), rhodium (Rh), copper alloy, aluminum alloy, molybdenum alloy, tungsten alloy, gold alloy, chromium alloy, nickel alloy, platinum alloy, titanium alloy, tantalum alloy, iridium alloy, rhodium alloy, any other suitable conductive material, or a combinations thereof. In some embodiments, the materials for forming the source electrode 130, the drain electrode 132 and the vias 130a, 130b and 132a are different.

In some embodiments, the source electrode 130, the drain electrode 132 and the vias 130a, 130b and 132a may be formed by a chemical vapor deposition (CVD) process, a sputtering process, a resistance heating evaporation process, an electron beam evaporation process, a pulsed laser deposition process, any other applicable process or a combination thereof.

Figure 2:
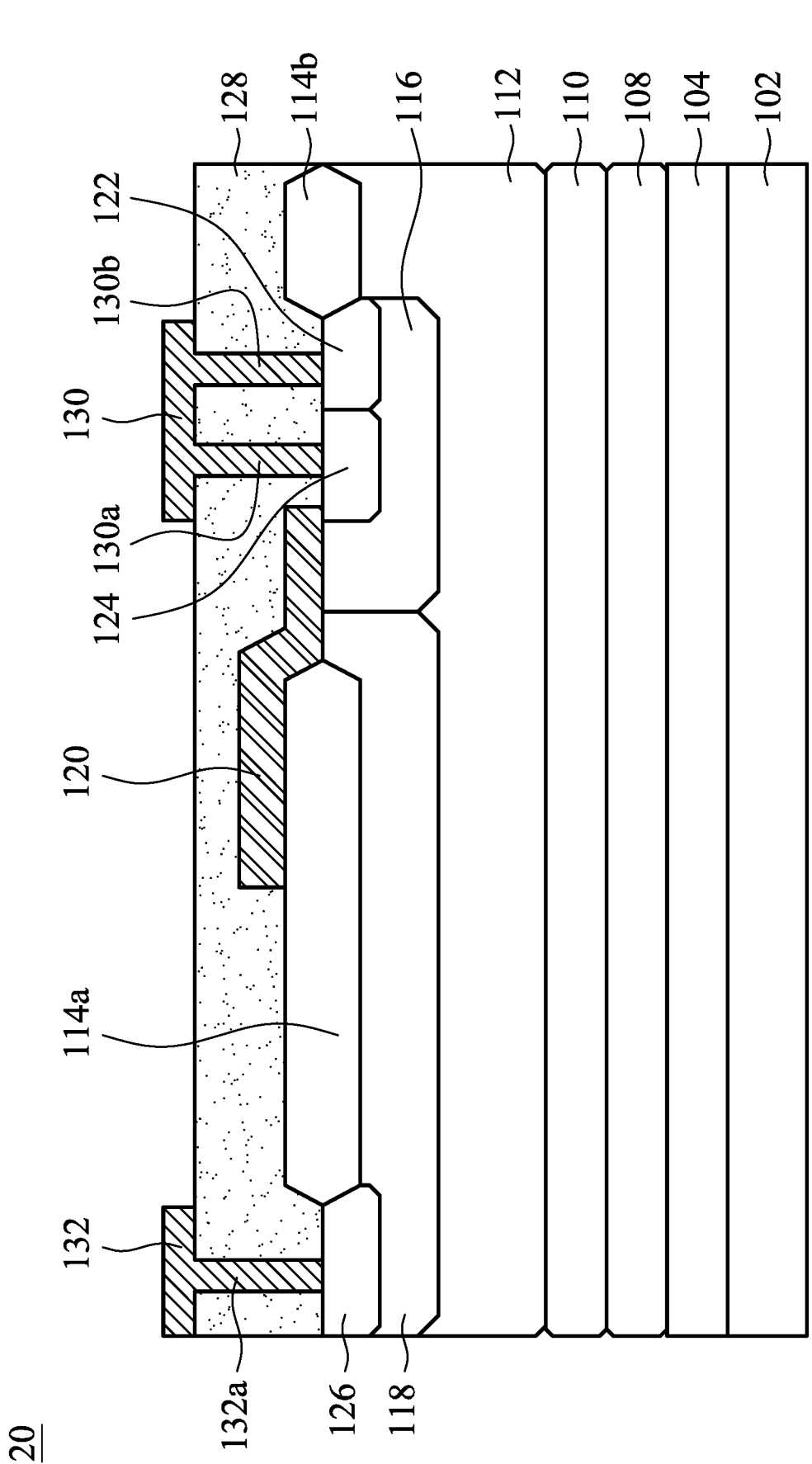
FIG. 2 illustrates the cross-sectional view of the semiconductor device in accordance with some embodiments of the present disclosure.

Next, referring to FIG. 2, FIG. 2 illustrates a cross-sectional view of the semiconductor device 20 in accordance with some other embodiments of the present disclosure. It should be understood that the same or similar elements or components in above and below contexts are represented by the same or similar reference numerals. The materials, manufacturing methods and functions of these elements or components are the same or similar to those described above, and thus will not be repeated herein. The semiconductor device 20 in the embodiment shown in FIG. 2 is similar to the semiconductor device 10 in the embodiment shown in FIG. 1H. The difference between them is that the first epitaxial layer 108 is directly disposed over the oxide layer 104, and the semiconductor layer 106 is not provided in the semiconductor device 20. In this embodiment, the first epitaxial layer 108 may be in direct contact with the oxide layer 104.

Figure 3:
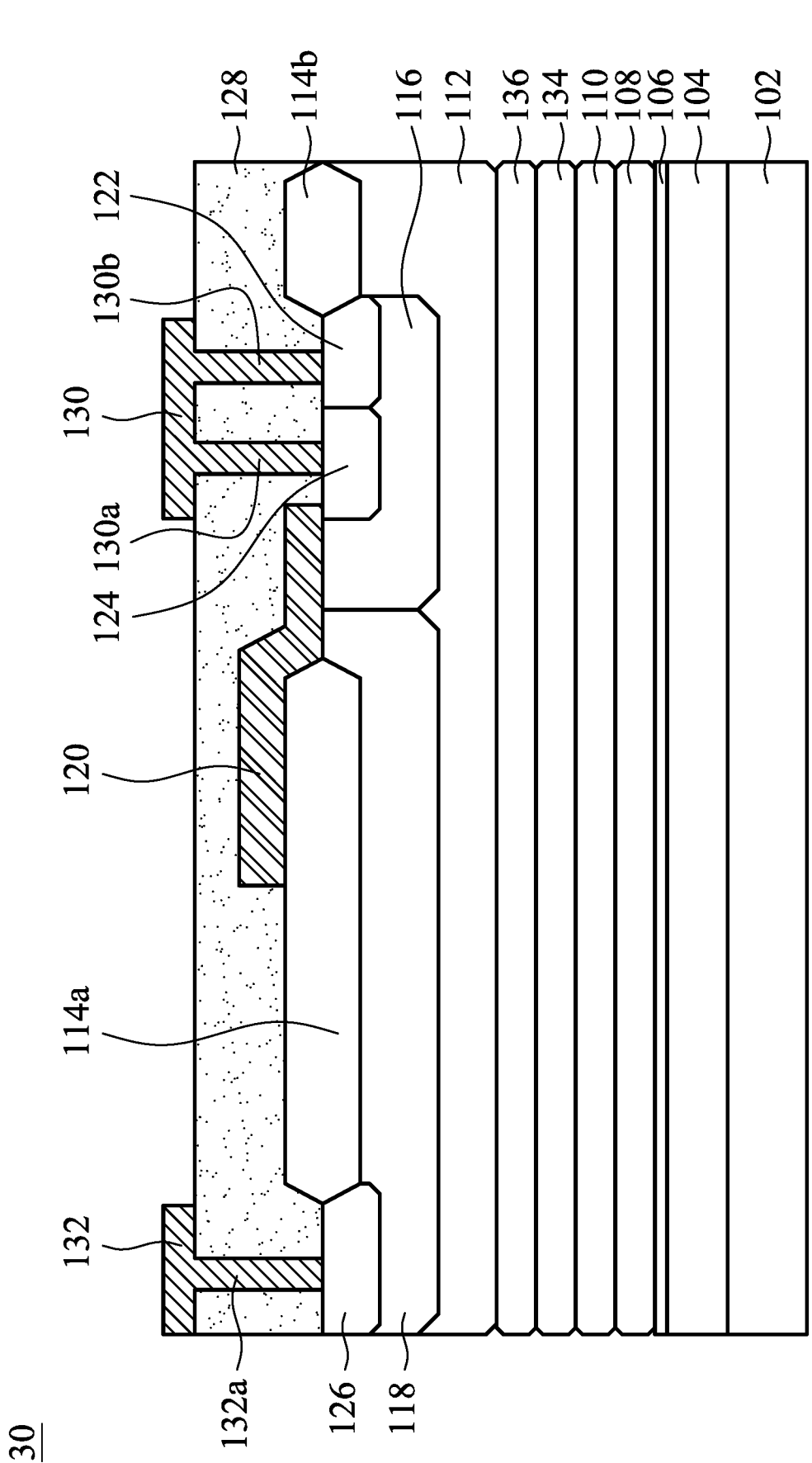
FIG. 3 illustrates the cross-sectional view of the semiconductor device in accordance with some embodiments of the present disclosure.

Next, referring to FIG. 3, FIG. 3 illustrates a cross-sectional view of the semiconductor device 30 in accordance with some other embodiments of the present disclosure. The difference between the semiconductor device 30 in the embodiment shown in FIG. 3 and the semiconductor device 10 in the embodiment shown in FIG. 1H is that, the semiconductor device 30 further includes a fourth epitaxial layer 134 and a fifth epitaxial layer 136 disposed between the second epitaxial layer 110 and the third epitaxial layer 112. In addition, the fifth epitaxial layer 136 is disposed between the third epitaxial layer 112 and the fourth epitaxial layer 134. In some embodiments, the fourth epitaxial layer 134 is in direct contact with the fifth epitaxial layer 136, and the fourth epitaxial layer 134 and the fifth epitaxial layer 136 are also in direct contact with the second epitaxial layer 110 and the third epitaxial layer 112 respectively. In addition, the fourth epitaxial layer 134 has the first conductivity type, and the fifth epitaxial layer 136 has a second conductivity type that is opposite to the first conductivity type in accordance with some embodiments. Specifically, the fourth epitaxial layer 134 has p-type conductivity, and the fifth epitaxial layer 136 has n-type conductivity in accordance with some embodiments.

The fourth epitaxial layer 134 and the fifth epitaxial layer 136 may be formed of semiconductor materials. In some embodiments, the fourth epitaxial layer 134 and the fifth epitaxial layer 136 may be formed of silicon. In some embodiments, the fourth epitaxial layer 134 and the fifth epitaxial layer 136 may include other elementary semiconductor materials. In addition, the fourth epitaxial layer 134 includes the dopants of p-type conductivity while the fifth epitaxial layer 136 includes the dopants of n-type conductivity in accordance with some embodiments. In some embodiments, the dopant of p-type conductivity may include elements of group III, and the dopant of n-type conductivity may include elements of group V, but are not limited thereto. In some embodiments, the dopant concentration of the fourth epitaxial layer 134 and the fifth epitaxial layer 136 each is in a range from about $1 \times 10^{-15}$ cm$^3$ to about $1 \times 10^{-17}$ cm$^{-3}$.

In some embodiments, the fourth epitaxial layer 134 has a thickness in a range from about 0.5 µm to about 8 µm. In some embodiments, the fifth epitaxial layer 136 has a thickness in a range from about 0.5 µm to about 8 µm. In addition, in some embodiments, the total thickness of the first epitaxial layer 108, the second epitaxial layer 110, the fourth epitaxial layer 134, and the fifth epitaxial layer 136 is in a range from about 3 µm to about 11 µm. In addition, the fourth epitaxial layer 134 and the fifth epitaxial layer 136 may also be formed by an epitaxial growth process.

In this embodiment, the semiconductor device 30 includes the stacked structure of the first epitaxial layer 108, the second epitaxial layer 110, the fourth epitaxial layer 134, the fifth epitaxial layer 136 and the third epitaxial layer 112 which have a particular combination of conductivity types (i.e. the stacked structure of the p-type first epitaxial layer 108, the n-type second epitaxial layer 110, the p-type fourth epitaxial layer 134, the n-type fifth epitaxial layer 136 and the p-type third epitaxial layer 112) can effectively shield signal interference from the backside of the substrate 102. With such a configuration, the influence of the backside bias effect on the semiconductor device can be decreased and the performance of the semiconductor device can be improved accordingly.

In addition, it should be understood that the semiconductor device may have any stacked structure of epitaxial layers having the combination of conductivity types p-n-(p-n)$_x$-p (wherein x≥1) in accordance with some other embodiments, as long as the semiconductor device has the efficacy of reducing the backside bias effect.

The semiconductor stricture includes the stacked structure of epitaxial layers having a particular combination of conductivity types (for example, the p-type first epitaxial layer 108—the n-type second epitaxial layer 110—the p-type third epitaxial layer 112 of the semiconductor device 10 as shown in FIG. 1H) in accordance with some embodiments of the present disclosure. However, typical semiconductor devices do not have the epitaxial stack of the specific conductivity types as described above. In an example, an exemplary semiconductor device 40 (not illustrated) is provided. The semiconductor device 40 is similar to that shown in FIG. 1H, but it does not have the first epitaxial layer 108 and second epitaxial layer 110.

Figure 4A:
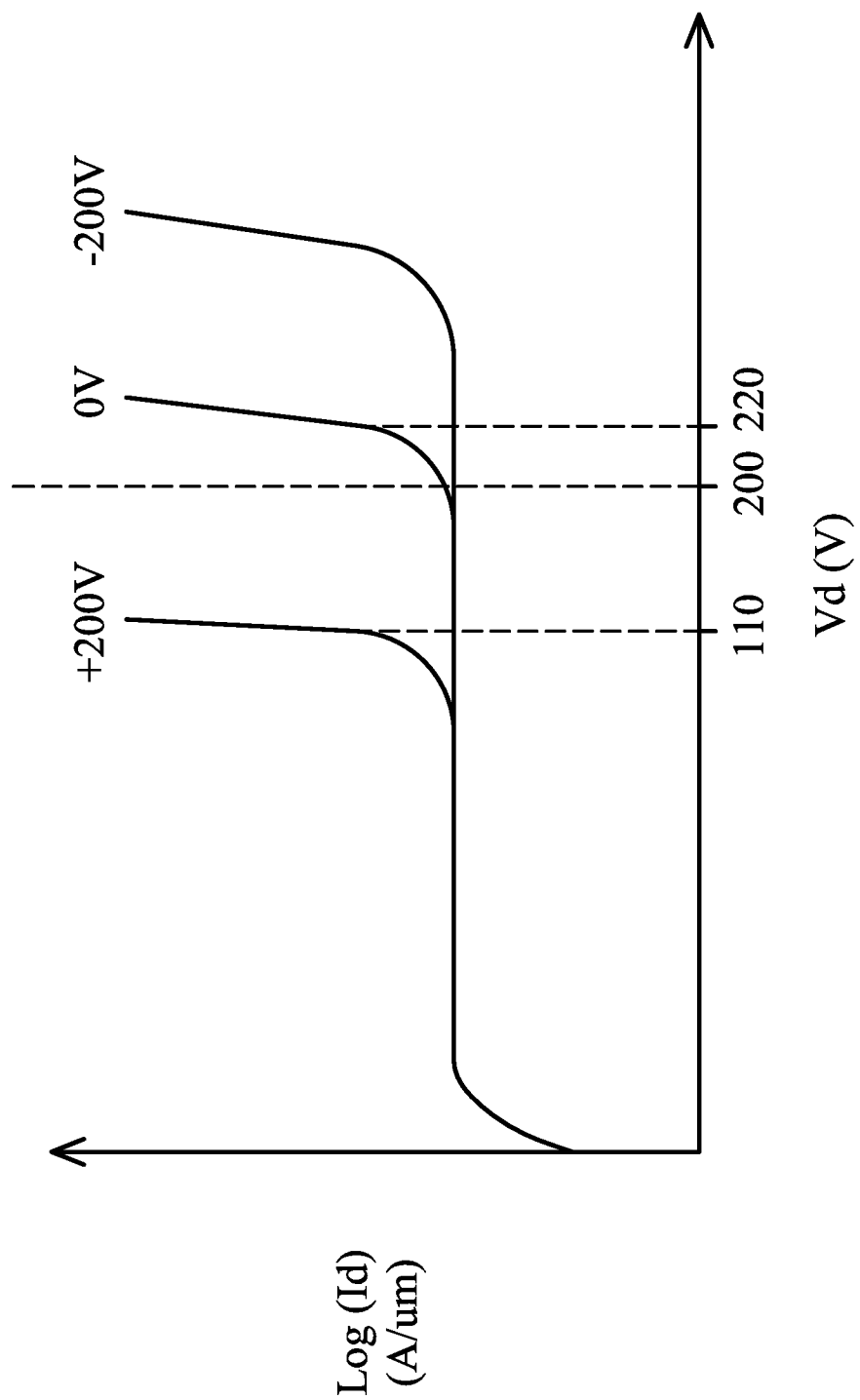
FIGS. 4A and 4B are the results of the performance test of breakdown voltage of the semiconductor devices in accordance with some embodiments of the present disclosure.
Figure 4B:
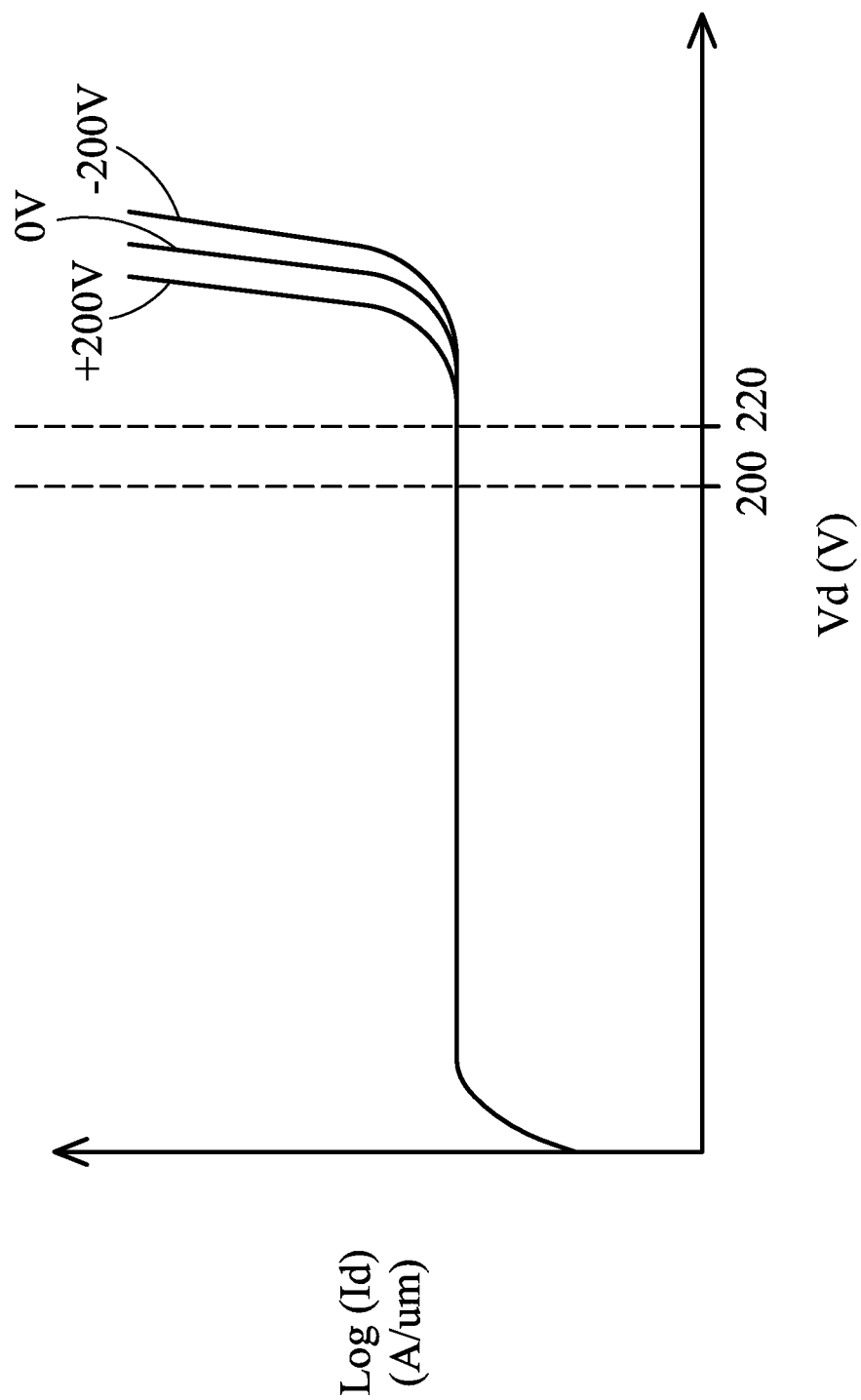

Referring to FIGS. 4A and 4B, FIGS. 4A and 4B are the results of the performance test of breakdown voltage of the semiconductor devices in accordance with some embodiments of the present disclosure. Specifically, FIGS. 4A and 4B are schematic diagrams showing the breakdown voltage test results of a semiconductor device having the voltage specification of 200 volts (V) (the horizontal axis and the vertical axis represent the voltage value and current value of the drain electrode respectively). However, it should be understood that the semiconductor device according to the embodiments of the present disclosure is not limited to the structure with a voltage specification of 200 volts. FIGS. 4A and 4B show the test results of the exemplary semiconductor device 40 and the semiconductor device 10 in accordance with some embodiments of the present disclosure, respectively. According to FIGS. 4A and 4B, compared to the semiconductor device 40, the semiconductor device 10 has a relatively uniform breakdown voltage under different currents and has better stability.

Therefore, it is known that compared to the general semiconductor device 40 without the p-n-p epitaxial stack, the semiconductor device 10 that includes the p-n-p epitaxial stack provided in the embodiments of the present disclosure can more effectively shield signal interference from the backside of the substrate and reduce the influence of backside bias effect on the semiconductor device.

To summarize the above, the semiconductor device provided in the present disclosure includes the epitaxial stacked having a specific combination of conductivity types (for example, the epitaxial stack consisting of p-type epitaxial layer—n-type epitaxial layer—p-type epitaxial layer) so that the influence of the backside bias effect on the semiconductor device can be reduced, and the performance of the semiconductor device can be improved. In addition, compared with the n-type or p-type semiconductor layers generally formed by the ion implantation process, the n-type or p-type epitaxial layer formed by the epitaxial growth process can have fewer defects and damages, and can further reduce the occurrence of current leakage.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a substrate;
    an oxide layer disposed over the substrate;
    a first epitaxial layer disposed over the oxide layer and having a first conductivity type;
    a second epitaxial layer disposed over the first epitaxial layer and having a second conductivity type that is opposite to the first conductivity type;
    a third epitaxial layer disposed over the second epitaxial layer and having the first conductivity type;
    a fourth epitaxial layer disposed between the second epitaxial layer and the third epitaxial layer, and having the first conductivity type; and
    a fifth epitaxial layer disposed between the fourth epitaxial layer and the third epitaxial layer, and having the second conductivity type.

2. The semiconductor device as claimed in claim 1, wherein the first conductivity type is p-type and the second conductivity type is n-type.

3. The semiconductor device as claimed in claim 1, wherein the substrate has the first conductivity type or the second conductivity type.

4. The semiconductor device as claimed in claim 1, further comprising a semiconductor layer disposed between the oxide layer and the first epitaxial layer.

5. The semiconductor device as claimed in claim 1, wherein the second epitaxial layer is in contact with the first epitaxial layer and the third epitaxial layer.

6. The semiconductor device as claimed in claim 1, further comprising:
    a first well region disposed in the third epitaxial layer;
    a second well region disposed in the third epitaxial layer and adjacent to the first well region;
    a source electrode and a drain electrode respectively disposed over the first well region and the second well region; and
    a gate structure disposed between the source electrode and the drain electrode, and partially overlapping the first well region and the second well region.

7. The semiconductor device as claimed in claim 6, wherein the first well region has the first conductivity type and the second well region has the second conductivity type.

8. The semiconductor device as claimed in claim 6, wherein the first well region has the second conductivity type and the second well region has the first conductivity type.

9. A method for forming the semiconductor device as set forth in claim 1, comprising:
    providing a substrate;
    forming an oxide layer over the substrate;
    forming a first epitaxial layer over the oxide layer, wherein the first epitaxial layer comprises dopants of a first conductivity type;
    forming a second epitaxial layer over the first epitaxial layer, wherein the second epitaxial layer comprises dopants of a second conductivity type that is opposite to the first conductivity type;
    forming a third epitaxial layer over the second epitaxial layer, wherein the third epitaxial layer comprises dopants of the first conductivity type;
    forming a fourth epitaxial layer disposed between the second epitaxial layer and the third epitaxial layer, wherein the fourth epitaxial layer comprises dopants of the first conductivity type; and
    forming a fifth epitaxial layer disposed between the fourth epitaxial layer and the third epitaxial layer, wherein the fifth epitaxial layer comprises dopants of the second conductivity type.

10. The method for forming a semiconductor device as claimed in claim 9, wherein the first conductivity type is p-type and the second conductivity type is n-type.

11. The method for forming a semiconductor device as claimed in claim 9, wherein the first epitaxial layer, the second epitaxial layer and the third epitaxial layer are formed by an epitaxial growth process.

12. The method for forming a semiconductor device as claimed in claim 9, further comprising:
    forming a semiconductor layer disposed between the oxide layer and the first epitaxial layer.

13. The method for forming a semiconductor device as claimed in claim 12, wherein the substrate, the oxide layer and the semiconductor layer are formed by a separation by implantation of oxygen (SIMOX) process.

14. The method for forming a semiconductor device as claimed in claim 9, wherein the fourth epitaxial layer and the fifth epitaxial layer are formed by an epitaxial growth process.

15. The method for forming a semiconductor device as claimed in claim 9, further comprising:
    forming a first well region disposed in the third epitaxial layer;
    forming a second well region disposed in the third epitaxial layer and adjacent to the first well region;
    forming a source electrode and a drain electrode respectively disposed over the first well region and the second well region; and
    forming a gate structure disposed between the source electrode and the drain electrode, and partially overlapping the first well region and the second well region.

16. A semiconductor substrate structure, comprising:
a substrate;
an oxide layer disposed over the substrate;
a first epitaxial layer disposed over the oxide layer and having a first conductivity type;
a second epitaxial layer disposed over the first epitaxial layer and having a second conductivity type that is opposite to the first conductivity type;
a third epitaxial layer disposed over the second epitaxial layer and having the first conductivity type;
a fourth epitaxial layer disposed between the second epitaxial layer and the third epitaxial layer, and having the first conductivity type; and
a fifth epitaxial layer disposed between the fourth epitaxial layer and the third epitaxial layer, and having the second conductivity type.

17. The semiconductor substrate structure as claimed in claim 16, wherein the first conductivity type is p-type and the second conductivity type is n-type.

18. The semiconductor substrate structure as claimed in claim 16, wherein the second epitaxial layer is in contact with the first epitaxial layer and the third epitaxial layer.

\* \* \* \* \*